US006238935B1

(12) United States Patent
Egley et al.

(10) Patent No.: US 6,238,935 B1
(45) Date of Patent: May 29, 2001

(54) SILICON-ON-INSULATOR WAFER HAVING CONDUCTIVE LAYER FOR DETECTION WITH ELECTRICAL SENSORS

(75) Inventors: James L. Egley; George M. Gut; Daniel J. Koch; Michael A. Matusewic, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/260,404

(22) Filed: Mar. 1, 1999

Related U.S. Application Data

(62) Division of application No. 08/224,451, filed on Apr. 7, 1994, now Pat. No. 5,877,094.

(51) Int. Cl.[7] ................................................. H01L 21/00
(52) U.S. Cl. ................................. 438/5; 438/10; 438/17; 438/406; 438/455
(58) Field of Search ..................... 438/5, 10, 17, 438/404, 406, 455

(56) References Cited

U.S. PATENT DOCUMENTS

| 4,230,505 | 10/1980 | Wu et al. | 148/1.5 |
|---|---|---|---|
| 4,348,803 | 9/1982 | Sasaki | 29/574 |
| 4,608,095 | 8/1986 | Hill | 148/33 |
| 4,608,096 | 8/1986 | Hill | 148/33 |
| 4,732,867 | 3/1988 | Schnable | 437/22 |
| 4,755,482 | 7/1988 | Nagakubo | 437/84 |
| 5,006,479 | 4/1991 | Brandewie | 437/45 |
| 5,130,264 | 7/1992 | Troxell et al. | 437/40 |

FOREIGN PATENT DOCUMENTS

| 55-41709 | 3/1980 | (JP) | H01L/21/86 |
|---|---|---|---|
| 55-153347 | 11/1980 | (JP) | H01L/21/78 |
| 57-153445 | 9/1982 | (JP) | H01L/21/86 |
| 57-162346 | * 10/1982 | (JP) . | |

OTHER PUBLICATIONS

IBM Technical Disclosure Bulletin, vol. 16, No. 10, Mar. 1974, pp. 3166–3167, "Diode–Capacitor Memory Cells Supported on a Sapphire Substrate" by G.F. Guhman.
IBM Technical Disclosure Bulletin, vol. 16, No. 10, Mar. 1974, pp. 3168–3169., "Capacitor–Diode Memory Cell Process" by H.L. Kalter.

* cited by examiner

*Primary Examiner*—Trung Dang
(74) *Attorney, Agent, or Firm*—Roy W. Truelson

(57) ABSTRACT

A method for fabricating a silicon-on-sapphire wafer for processing by silicon-wafer-processing equipment. A layer is deposited on a backside of a silicon-on-sapphire wafer, the layer having optical and electrical properties of silicon, wherein the silicon-on-sapphire wafer may be sensed by a sensor designed to sense a presence of a silicon wafer.

13 Claims, 2 Drawing Sheets

SILICON-ON-INSULATOR WAFER HAVING CONDUCTIVE LAYER FOR DETECTION WITH ELECTRICAL SENSORS

CROSS REFERENCE TO RELATED APPLICATION

The present application is a divisional application of application Ser. No. 08/224,451, filed Apr. 4, 1994, now issued as U.S. Pat. No. 5,877,094, which is herein incorporated by reference.

BACKGROUND OF THE INVENTION

1. Technical Field

The present invention relates in general to integrated circuits and in particular to a method for manufacturing wafers for use in manufacturing integrated circuits. Still more particularly, the present invention relates to a method for manufacturing a silicon-on-sapphire wafer.

2. Description of the Related Art

The use of sapphire substrates in the production of semiconductor devices, such as silicon-on-sapphire (SOS) devices, has greatly increased. SOS integrated circuit technology is a promising field for advanced high speed integrated circuits for computer and microwave applications.

Integrated circuit manufacturing equipment has evolved in recent years through the use of robotic wafer transfer systems. For those robotic wafer transfer systems to function, the robot must be able to sense either optically or electrically the presence of a silicon wafer. These robot sensors have evolved around the properties of a silicon wafer—the sensors are looking for an opaque, conductive object. This sensor evolution has rendered these tools incompatible for manufacturing integrated circuits using wafers with properties different than those of silicon wafers. The ability to process SOS wafers with standard silicon-wafer-processing equipment is important for a profitable SOS manufacturing environment. However, since the SOS wafer is translucent and an insulator, the SOS wafer is an example of a substrate that is incompatible with common silicon wafer integrated circuit processing equipment.

Therefore, it would be advantageous to have a SOS wafer that is compatible with presently available silicon wafer integrated circuit processing equipment.

SUMMARY OF THE INVENTION

It is therefore one object of the present invention to provide an improved method for processing integrated circuits.

It is another object of the present invention to provide an improved method for processing integrated circuits on silicon-on-sapphire wafers using equipment designed for processing silicon wafers.

It is yet another object of the present invention to provide an improved silicon-on-sapphire wafer that can be processed by silicon-wafer-processing equipment.

The foregoing objects are achieved as is now described. The present invention allows for a backside wafer coating process that makes SOS wafers compatible with common semiconductor processing equipment and processing conditions. This compatibility is accomplished by depositing a layer on a backside of a silicon-on-sapphire wafer, the layer having optical and electrical properties of silicon, wherein the silicon-on-sapphire wafer may be sensed by sensors designed to sense a presence of a silicon wafer.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

The process steps and structures described below do not form a complete process flow for manufacturing integrated circuits. The present invention can be practices in conjunction with integrated circuit fabrication techniques currently used in the art, and only so much of the commonly practiced process steps are included as are necessary for an understanding of the present invention. The figures representing fragmentary sections of portions of an integrated circuit during fabrication are not drawn to scale, but instead are drawn so as to illustrate the important features of the invention.

The present invention provides a way to process both silicon and SOS wafers on a common production tool set without changing or bypassing robotic wafer sensors. In accordance with a preferred embodiment of the present invention, the SOS wafers are coated with a material that is sufficiently opaque, conductive and compatible with the harsh conditions of a semiconductor manufacturing process to make these wafers SOS compatible with common silicon-wafer-processing equipment and conditions.

Figure 1:
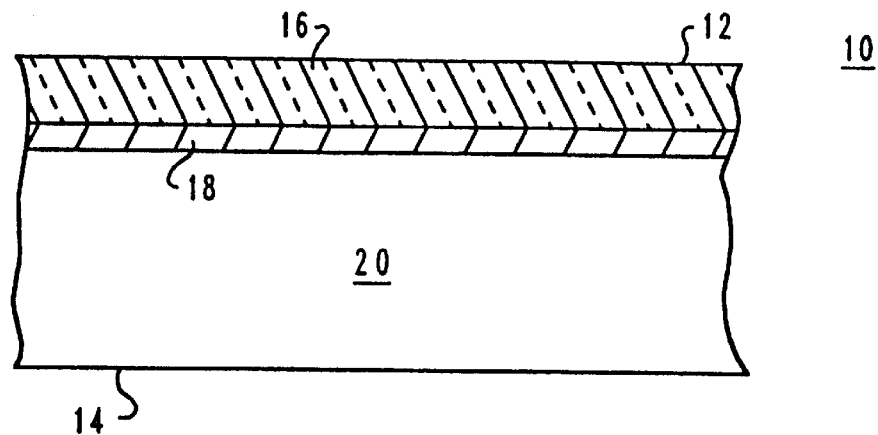
FIG. 1 depicts a fragmentary section view of a silicon-on-sapphire wafer in which a preferred embodiment of the present invention may be implemented.

Referring to FIG. 1 a fragmentary section view of a SOS wafer is depicted. Wafer 10 has a front surface 12 and a back surface 14 and typically includes an oxide layer 16, a silicon layer 18, and a sapphire layer 20. In a typical SOS wafer such as wafer 10, oxide layer 16 is comprised of silicon dioxide and is about 3,600 Å thick. Silicon layer 18 is 1000 Å and sapphire layer 20 is 640 microns thick. Wafer 10 is a round wafer and is 125 millimeters in diameter in the depicted example. Of course, other wafer sizes and shapes may be processed according to the present invention.

Figure 2A:
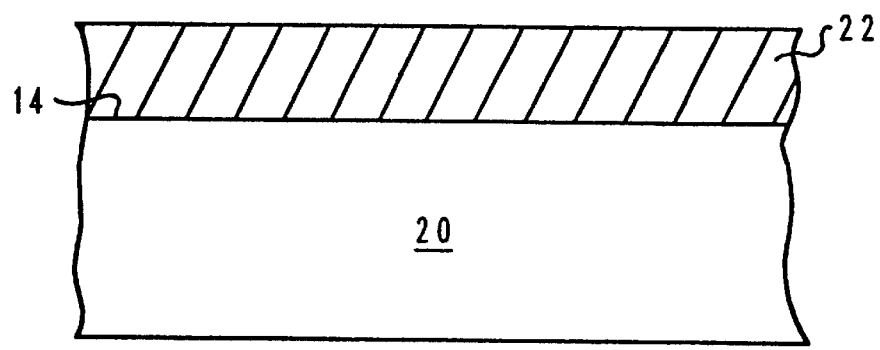
FIGS. 2A–2C are fragmentary section views illustrating a process for fabricating a silicon-on-sapphire wafer according to the present invention.
Figure 2B:
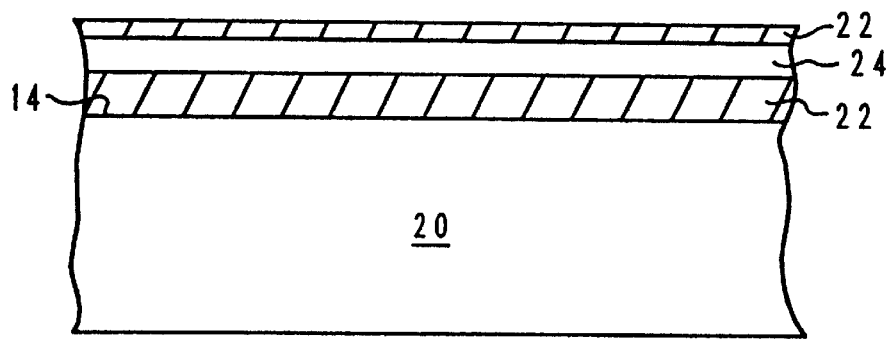
Figure 2C:
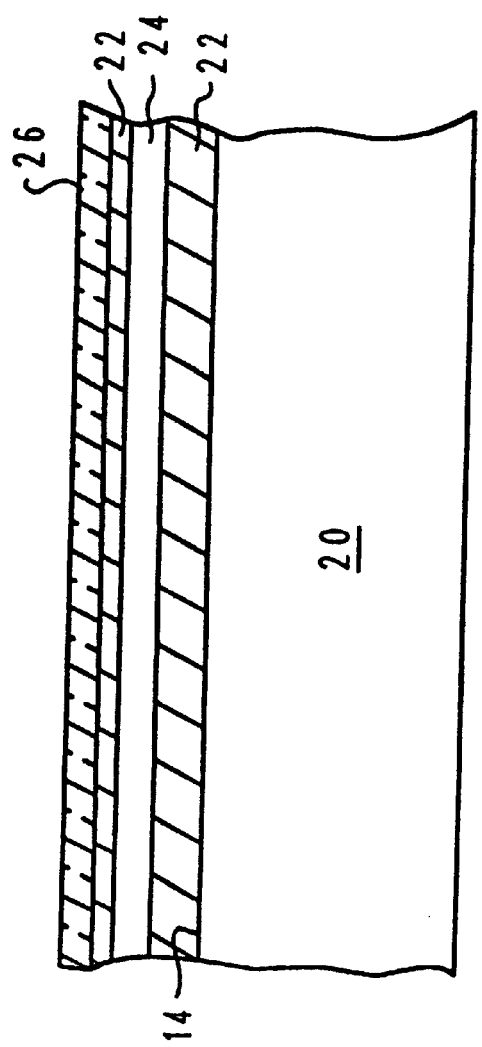

FIGS. 2A–2C are fragmentary section views of a portion of wafer 10. In these figures, wafer 10 is flipped over with respect to FIG. 1—the backside of wafer 10 is on top and back surface 14 is on top. Also the layers, other than sapphire layer 20, in wafer 10 are not shown in these figures. Polycrystalline silicon, also called "polysilicon", layer 22 is deposited on sapphire layer 20, as illustrated in FIG. 2A. The polysilicon is deposited on sapphire layer 20 to provide optical characteristics similar to that found in a silicon wafer such that sensors in silicon-wafer-processing equipment designed to optically detect silicon wafers can detect wafer 10. Polysilicon layer 22 is 2.3 microns thick in the depicted example. The polysilicon in polysilicon layer 22 is a low pressure chemical vapor deposition (LPCVD) polysilicon in this example. The LPCVD process employed coats the front and back side of the wafer with polysilicon. Polysilicon layer 22 is usually at least about 2 microns thick.

A dopant, such as phosphorous, is implanted into polysilicon layer 22 to form region 24, as depicted in FIG. 2B. The implantation is performed to provide conductivity similar that of a silicon wafer such that electrical sensors in silicon-wafer-processing equipment, designed to detect silicon wafers based on conductivity of the wafer, can detect wafer 10. In the depicted example, the implant species is P+ (31 amu), the dose is $1.0\ominus16$ $l/cm^2$, and the energy is 175 KeV. The phosphorus dose determines the amount of dopant material that the backside polycrystalline silicon receives. Implant energy can be as low as 25 KeV.

Other schemes for doping the polycrystalline silicon are equally applicable. These schemes include solid source diffusion and high temperature anneals in a doping gas (i.e., POCl) environment. Upon subsequent thermal processing, the implant species is electrically activated to yield a conductive polysilicon layer. Also, various other dopants may be used, such as, for example, boron.

After implantation, region 24 typically should have a resistivity of less than about 50 ohms/square. A resistivity greater than or equal to 50 ohms/square might result in too much resistivity for silicon wafer equipment to recognize wafer 10 as a silicon wafer based on conductivity characteristics.

Next in FIG. 2C, a silicon nitride layer 26 is deposited over polysilicon layer 22. Silicon nitride layer 26 is employed as a protective layer to protect polysilicon layer 22 and region 24 during subsequent processing of wafer 10. In the depicted example, 950 Å of low pressure chemical vapor deposition (LPCVD) silicon nitride is deposited over polysilicon layer 22. Silicon nitride layer 22 may be of different thickness, such as, from about 500 Å to about 5000 Å. The selected thickness of silicon nitride layer 26 should be sufficient protect the polysilicon layer from later processes applied to wafer 10.

Figure 3:
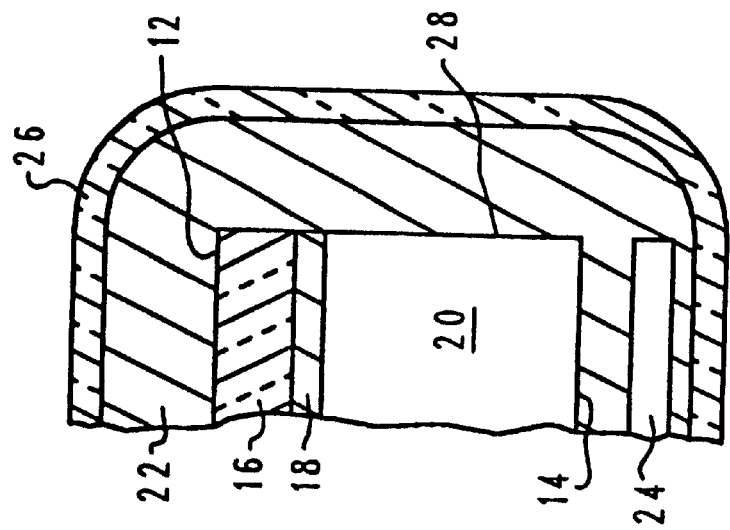
FIG. 3 depicts a fragmentary section view of an edge of a silicon-on-sapphire wafer processed in accordance with a preferred embodiment of the present invention.

Referring now to FIG. 3, a fragmentary section view of an edge of wafer 10 is illustrated. In FIG. 5, wafer 10 is now shown with back surface 14 on the bottom and front surface 12 on the top. As can be seen, edge 28 of wafer 10 is covered by polysilicon layer 22 and silicon nitride layer 26. Although these layers are present on edge 28, they are not necessary in accordance with a preferred embodiment of the present invention. Front surface 12 also has been covered by polysilicon layer 22 and silicon nitride layer 26. A doped region such as region 24, however, is not present in the polysilicon layer covering front surface 12 and edge 28 because ion implanting is performed only on one side.

The wafer front side is reactive ion etched back to remove the silicon nitride layer 26 and the poly silicon layer 22 to expose the underlying silicon dioxide layer 16. When the polysilicon and the nitride covering front surface 12 are removed, wafer 10 is then ready for processing in silicon-wafer-processing equipment.

Thus, SOS wafers processed according to a preferred embodiment of the present invention are sufficiently opaque for optical sensors to detect the presence of a wafer. This is accomplished by the deposition of the polysilicon on the backside of the SOS wafer. The polysilicon thickness is an appropriate minimal thickness for an indirect bandgap absorption process which is sufficient for optical sensors to detect an opaque object. The amount of polysilicon deposited may need to be varied depending on the optical sensor system employed by the equipment. The thickness of the polysilicon also may vary depending on the light wavelength employed by the silicon-wafer-processing equipment. Red and infra-red light have wavelengths currently used by silicon-wafer-processing equipment to optically sense the presence of a silicon wafer. Other wavelengths may affect how thick the polysilicon layer should be to allow an SOS wafer to be detected by an optical sensor used silicon-wafer-processing equipment.

In addition, the SOS wafer processed according to the present invention has a conductive backside. This conductivity is achieved by ion implantation of phosphorus into the backside polycrystalline silicon. The resulting polysilicon layer is a conductive one.

In addition to having optical and conductive properties similar to a silicon wafer, the process of the present invention does not create a contamination level or defect density on front side of the wafer which could affect yield.

The resulting coating on the backside of a SOS wafer processed according to the present invention is compatible with subsequent silicon processing steps. This compatibility may be accomplished by the films selected and the order in which they were deposited. The polysilicon and silicon nitride are compatible with all thermal processes in subsequent steps. The silicon nitride outer coating also is a diffusion barrier that prevents the backside dopant from diffusing through the nitride surface and causing autodoping problems with the wafer front side silicon devices. In addition, the silicon nitride outer coating is inert to all acids except hot phosphoric which will not be used in any subsequent steps.

The resulting wafer processed according to the present invention may be processed on silicon-wafer-processing equipment, such as, for example, a GCA 8500 stepper available from Integrated Solutions, Inc., located in Austin, Tex.; AME 5000 applied materials unit available from Applied Materials, Inc., located in Santa Clara, Calif.; a Varian 2000 sputterer, available from Varian, Inc., located in Gloucester, Mass.; and a Tegal 1511 etcher available from Tegal, Inc., located in Petaluma, Calif. Although the depicted embodiment uses a SOS wafer, the present invention may be employed to manufacture other types of wafers for processing in silicon-wafer-processing equipment.

While the invention has been particularly shown and described with reference to a preferred embodiment, it will be understood by those skilled in the art that various changes in form and detail may be made therein without departing from the spirit and scope of the invention.

What is claimed is:

1. A silicon-on-insulator wafer comprising:
   a non-silicon electrically insulating substrate; and
   a polycrystalline silicon layer on the backside, wherein the layer has electrical properties allowing the silicon-on-insulator wafer to be detected by an electrical sensor configured to sense a silicon wafer, wherein the polycrystalline silicon layer includes a doped region having electrical properties allowing the silicon-on-insulator wafer to be detected by an electrical sensor configured to detect a silicon wafer.

2. The silicon-on-insulator wafer of claim 1, wherein the polycrystalline silicon layer has a thickness of at least 2 microns.

3. The silicon-on-insulator wafer of claim 1, wherein the doped region includes implanted phosphorous ions.

4. The silicon-on-insulator wafer of claim 1, wherein the polycrystalline silicon layer with the doped region has a resistivity less than about 50 ohms per square.

5. The silicon-on-insulator wafer of claim 1, further comprising a layer of silicon nitride deposited on the polycrystalline silicon layer.

6. The silicon-on-insulator wafer of claim 5, wherein the silicon nitride layer is a low pressure chemical vapor deposition silicon nitride layer.

7. The silicon-on-insulator wafer of claim 5, wherein the silicon nitride layer is from about 500 Å to about 5000 Å thick.

8. A wafer for an integrated circuit, comprising:

a sapphire substrate; and a polycrystalline silicon layer deposited on the backside of the substrate, said polycrystalline silicon layer including a doped region having electrical resistivity sufficiently low to permit recognition of the wafer by a device designed to detect wafers based on electrical resistivity.

9. The wafer of claim 8, wherein said electrical resistivity is less that about 50 ohms per square.

10. The wafer of claim 8, wherein the polycrystalline layer is at least about 2 microns thick.

11. The wafer of claim 8, wherein said doped region includes implanted phosphorous ions.

12. The wafer of claim 8, further comprising a layer of silicon nitride deposited on the polycrystalline silicon layer.

13. The wafer of claim 1, wherein the non-silicon electrically insulating substrate comprises sapphire.

* * * * *